United States Patent
Davey et al.

(10) Patent No.: US 9,059,690 B2
(45) Date of Patent: *Jun. 16, 2015

(54) METHOD AND APPARATUS FOR REDUCING THE CONTRIBUTION OF NOISE TO DIGITALLY SAMPLED SIGNALS

(71) Applicant: Rockstar Consortium US LP, Plano, TX (US)

(72) Inventors: Jonathan Davey, Kanata (CA); Russell Jones, Ottawa (CA)

(73) Assignee: RPX Clearinghouse LLC, San Francisco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/109,281

(22) Filed: Dec. 17, 2013

(65) Prior Publication Data

US 2014/0103980 A1  Apr. 17, 2014

Related U.S. Application Data

(63) Continuation of application No. 12/720,935, filed on Mar. 10, 2010, now Pat. No. 8,634,491.

(51) Int. Cl.
*H04L 7/00* (2006.01)
*H03K 5/08* (2006.01)
(Continued)

(52) U.S. Cl.
CPC ............... *H03K 5/08* (2013.01); *H03K 5/1534* (2013.01); *H03M 1/0629* (2013.01); *H03M 1/12* (2013.01)

(58) Field of Classification Search
CPC ....... H03M 1/12; H03M 1/66; H03M 1/0629; H03M 1/00; H03M 1/129; H03M 3/50; H03M 1/001; H03K 5/003; H03K 5/1534; H03K 5/01; H03K 5/125; H03K 5/131

USPC .......................................... 375/371; 370/345
See application file for complete search history.

(56) References Cited

U.S. PATENT DOCUMENTS 3,686,489 A   8/1972   Hobrough
4,430,641 A   2/1984   Baur et al.
(Continued)

FOREIGN PATENT DOCUMENTS

CN   1945978 A   4/2007
JP   63-064447   3/1988
(Continued)

OTHER PUBLICATIONS

Extended search report from corresponding EP application 11752766.3.

*Primary Examiner* — Chieh M Fan
*Assistant Examiner* — Sarah Hassan
(74) *Attorney, Agent, or Firm* — Anderson Gorecki & Rouille LLP

(57) ABSTRACT

The contribution of noise to digitally sampled signals is reduced using a statistical processor and a slope limiter. The statistical processor determines an average value (mean and/or standard deviation) of the filtered signal which is used to determine a slope limit corresponding to an expected maximum first derivative value of a target signal frequency. This slope limit is applied to constrain the output of an analog to digital converter, to prevent the output of the analog to digital converter from exceeding this maximum rate of rise or fall. By constraining the output of the analog to digital converter, it is possible to digitally sample analog signals without first utilizing an anti-aliasing filter, since the post processing of the digitally sampled signals limits the contribution of the higher frequency components of the signal to thereby enable a fully digital sampling and filtering circuit to be provided for receiving signals.

15 Claims, 6 Drawing Sheets

(51) Int. Cl.
  *H03K 5/1534*   (2006.01)
  *H03M 1/06*    (2006.01)
  *H03M 1/12*    (2006.01)

(56) References Cited

U.S. PATENT DOCUMENTS

| | | | | |
|---|---|---|---|---|
| 4,504,851 | A * | 3/1985 | Janko et al. | 348/184 |
| 4,821,260 | A * | 4/1989 | Klank et al. | 370/345 |
| 5,021,786 | A | 6/1991 | Gerdes | |
| 5,142,412 | A | 8/1992 | Deschamps et al. | |
| 5,212,733 | A | 5/1993 | DeVitt et al. | |
| 5,218,438 | A | 6/1993 | Kim | |
| 5,367,337 | A * | 11/1994 | Pyle et al. | 348/521 |
| 5,658,088 | A | 8/1997 | Samuelsson | |
| 5,828,705 | A | 10/1998 | Kroeger et al. | |
| 5,872,666 | A * | 2/1999 | Saiki et al. | 360/46 |
| 6,204,642 | B1 | 3/2001 | Lawson et al. | |
| 6,525,523 | B1 * | 2/2003 | Soma et al. | 324/76.77 |
| 6,943,712 | B1 * | 9/2005 | Roo et al. | 341/120 |
| 7,034,730 | B2 | 4/2006 | Siferd et al. | |
| 7,808,414 | B2 | 10/2010 | Fukuzawa et al. | |
| 2002/0176525 | A1 * | 11/2002 | Yamaguchi et al. | 375/371 |
| 2003/0031284 | A1 * | 2/2003 | Ishida et al. | 375/371 |
| 2003/0171100 | A1 * | 9/2003 | Petersson et al. | 455/141 |
| 2004/0109276 | A1 | 6/2004 | Mendenhall | |
| 2004/0208256 | A1 | 10/2004 | Spijker et al. | |
| 2005/0083220 | A1 | 4/2005 | Siferd et al. | |
| 2005/0102334 | A1 | 5/2005 | Honda | |
| 2005/0258908 | A1 | 11/2005 | Mitric | |
| 2006/0100860 | A1 * | 5/2006 | Oppelt | 704/201 |
| 2006/0114144 | A1 | 6/2006 | Lyden et al. | |
| 2009/0033913 | A1 * | 2/2009 | Mott | 356/51 |
| 2010/0066412 | A1 | 3/2010 | Bode | |

FOREIGN PATENT DOCUMENTS

| | | |
|---|---|---|
| JP | 05-010781 | 1/1993 |
| JP | 08-330905 | 12/1996 |
| JP | 11-62689 | 3/1999 |
| JP | 2000-068833 | 3/2000 |
| JP | 2003-018006 | 1/2003 |
| JP | 2005-189210 | 7/2005 |

* cited by examiner

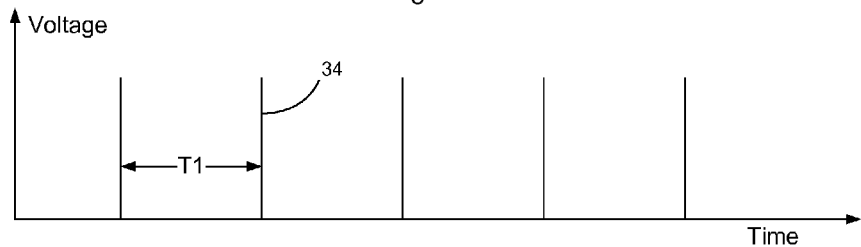
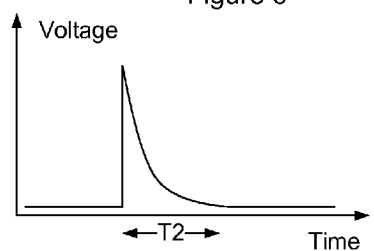
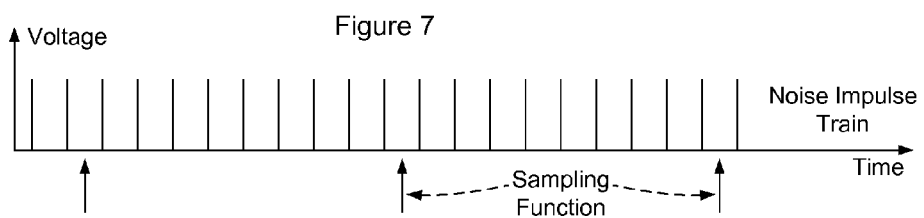
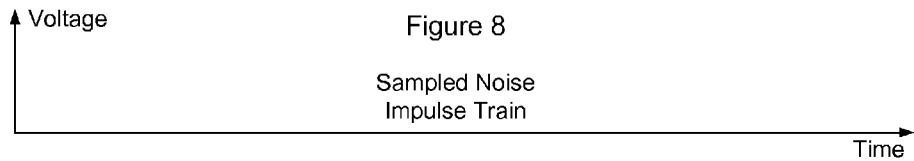

METHOD AND APPARATUS FOR REDUCING THE CONTRIBUTION OF NOISE TO DIGITALLY SAMPLED SIGNALS

CROSS-REFERENCE TO RELATED APPLICATIONS

This application is a continuation of U.S. patent application Ser. No. 12/720,935, filed Mar. 10, 2010, the content of which is hereby incorporated herein by reference.

TECHNICAL FIELD

The present invention relates to sampled data systems, and, more particularly, to a method and apparatus for reducing the contribution of noise to digitally sampled signals.

BACKGROUND

Sampled Data Systems process information from the external analog world by sampling the value of a desired signal at a regular interval and then processing these samples using numerical methods implemented on a digital computer. These sampled data systems may be used in process control, communication systems, or any other applicable context.

The frequency with which a sampled data system samples an incoming signal determines the frequency that the sampled data system is able to discriminate. Specifically, according to Nyquist's Criteria, a receiver can only discriminate frequencies that are less than one half the sampling frequency. If the input signal contains components that have frequencies above this level, those components will show up as aliases within the sampled band range. Accordingly, it is common to use anti-aliasing filters to attenuate higher frequency components from the signal prior to sampling.

FIG. 1 shows an example receiver 10 that is configured to receive an analog input signal 12 and convert the analog signal into digital form for processing by a digital computer 14. As shown in FIG. 1, the receiver includes an anti-aliasing filter 16 and an analog to digital converter 18. According to the Nyquist Criteria, a digitally sampled signal can only detect frequencies that are less than ½ the sampling rate. Any frequencies above this level will alias, i.e. show up incorrectly as lower frequency components. Accordingly, an anti-aliasing filter 16 is generally used to filter out or attenuate higher frequency components from the input signal 12. Once the higher frequency components are removed from the input signal the analog to digital converter 18 samples the signal and generates a digital value representative of the value of the signal at the sampled point in time. The output of the analog to digital converter 18 is input to the digital computer 14 for further processing.

Implementing an anti-aliasing filter increases the complexity of the receiver, which increases the cost of the receiver. Additionally, since the anti-aliasing filter operates on the signal prior to digitization, anti-aliasing filters are generally implemented with analog components. This prevents the receiver from being implemented as a fully digital circuit and increases the size of the receiver. Accordingly, it would be desirable to provide a way to process the signals digitally to avoid requiring the receiver to utilize an anti-aliasing filter.

SUMMARY

The following Summary and the Abstract set forth at the end of this application are provided herein to introduce some concepts discussed in the Detailed Description below. The Summary and Abstract sections are not comprehensive and are not intended to delineate the scope of protectable subject matter which is set forth by the claims presented below.

A method and apparatus for reducing the contribution of noise to digitally sampled signals includes a statistical processor and a slope limiter. The statistical processor determines an average value (mean and/or standard deviation) of the filtered signal which is used to determine a slope limit corresponding to an expected maximum first derivative value of a target signal frequency. This slope limit is applied to constrain the output of an analog to digital converter, to prevent the output of the analog to digital converter from exceeding this maximum rate of rise or fall. By constraining the output of the analog to digital converter, it is possible to digitally sample analog signals without first utilizing an anti-aliasing filter, since the post processing of the digitally sampled signals limits the contribution of the higher frequency components of the signal to thereby enable a fully digital sampling and filtering circuit to be provided for receiving signals.

BRIEF DESCRIPTION OF THE DRAWINGS

Aspects of the present invention are pointed out with particularity in the appended claims. The present invention is illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures:

FIG. 5 is a timeline showing an example noise signal;

FIG. 6 is a graph showing an example noise pulse;

FIG. 7 is a graph showing a noise impulse train and sampling function;

FIG. 8 is a graph showing the input of the sampled noise impulse train on value determined by the sampling function;

DETAILED DESCRIPTION

Figure 1:
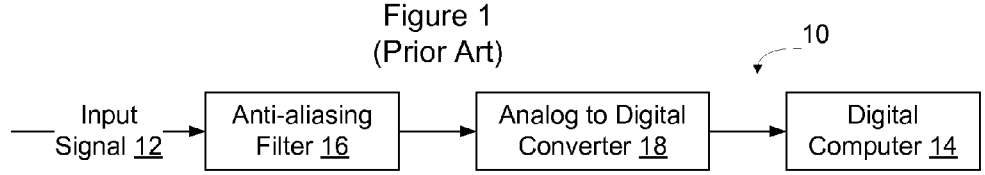
FIG. 1 is a functional block diagram showing a traditional sampled data system using an anti-aliasing filter to attenuate higher frequencies from an input signal prior to digital sampling.
Figure 2:
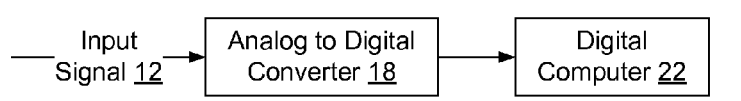
FIG. 2 is a functional block diagram showing a sampled data system implemented without an anti-aliasing filter according to an embodiment of the invention.

FIG. 2 shows an embodiment of the invention in which a digital computer 22 implements a signal restricting process instead of using an anti-aliasing filter to prevent higher frequency signals from excessively contributing to the output signal. This enables the signals to be converted to digital form without first requiring the analog signals to be passed through an anti-aliasing filter.

In the embodiment shown in FIG. 2, a receiver 20 includes an analog to digital converter 18 connected to the input signal without first having the input signal passed through an anti-aliasing filter. The output of the analog to digital converter is passed to a digital computer 22 that implements a signal restricting process which limits the rate of change of the output of the analog to digital converter to prevent the output of the analog to digital converter from rising or falling too much between samples. This effectively reduces the contribution of higher frequency signals to enable the received signals of the output to be digitally sampled without requiring the signals to be first passed through an anti-aliasing filter.

Many different Analog to Digital Conversion circuits have been developed, and the particular selection of an ADC will depend on the required resolution, response type (linear vs. non-linear), accuracy, error tolerance, and operating frequency. Since many different ADCs have been developed over time and these types of circuits are well known in the art, further details of how the ADC circuit works have been omitted to avoid obfuscation of the invention.

Figure 3:
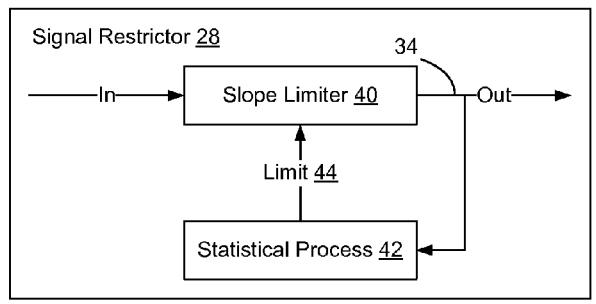
FIG. 3 is a functional block diagram of an embodiment of a signal restrictor for use in the embodiment shown in FIG. 2.
Figure 4:
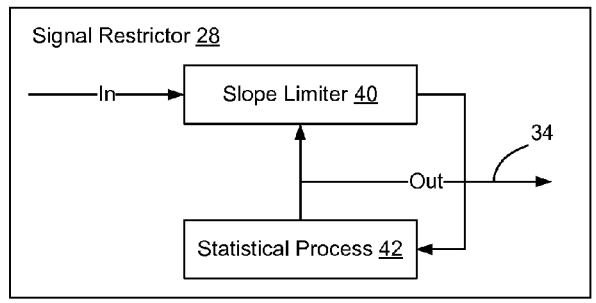
FIG. 4 is a functional block diagram of another embodiment of a signal restrictor for use in the embodiment shown in FIG. 2.

Once the signal has been sampled by the ADC, the output of the ADC is input to a digital computer implementing a signal restricting process. The signal restricting process operates to prevent a first derivative of the waveform associated with the output of the ADC from exceeding a slope limit, to constrain the max rate of change of the output of the ADC. FIGS. 3 and 4 show conceptually two example signal restrictors that may be used to restrict the output of the ADC circuit. In operation, the signal restrictor would be implemented as a digital circuit operating on digital values from the ADC. However, conceptually FIGS. 3 and 4 show how the signal restrictor operates to prevent higher frequency signals from unduly impacting the output of the ADC.

As shown in FIG. 3, the signal restrictor 28 includes a slope limiter 40 that prevents the output value from the ADC from changing too much between samples of the ADC. Specifically, the slope limiter receives an input signal IN from the ADC 26 and applies limits to the input signal to generate output signal OUT 34. The output signal 34 is also passed to statistical process 42 which sets limit 44 which is used by the slope limiter 40 to restrict the amount that the signal is allowed to change between successive samples of the ADC. By limiting the amount that the signal is allowed to change, the contribution of noise on the signal output from the ADC may be constrained.

In the example shown in FIG. 4, the signal restrictor 28 includes a slope limiter 40 and a statistical process like the embodiment shown in FIG. 3. However, rather than have the output signal provided by the slope limiter, the output signal of the slope limiter is provided to the statistical process. The output of the statistical process is provided both to the slope limiter and as the output from the signal restrictor. This embodiment is designed for use when the input analog waveform contains unipolar signals, so that the statistical processor can implement an average calculation to prevent the signals from changing too quickly.

The statistical processor can operate in several different ways to calculate the average and prevent the output signal from moving too drastically when compared to the average of the preceding signals. For example, the statistical processor may calculate the Arithmetic Mean by summing successive values of a selected number of preceding samples and dividing by the number of samples taken. This would be done via a "Moving Average Filter" which may be implemented using a FIFO or other data structure to store the preceding samples. As a sample is received it is compared with the average of the preceding set of samples to verify that the sample does not deviate from the average of the preceding samples by more than a Limit amount. If the sample does exceed the average by more than the limit, the value of the sample is clamped at the average plus the limit (or minus the limit) to reduce the contribution of the noise on the sample. After the comparison the sample is added to the FIFO and the oldest sample is removed. This enables a moving average to be calculated. The length of the FIFO is determined by the number of samples used in the average.

The statistical processor may alternatively calculate the Standard Deviation over a fixed number of samples to prevent the signal from moving more than a set amount relative to the previous samples. This would be used when the Mean is zero. In some instances it may be desirable to use both calculations.

The system operates statistically and works particularly well where the higher frequency signals to be suppressed do not correlate with either the sampled or sampling function. For example, noise generally does not correlate with the sampling function and, hence, the system works particularly well filtering noise from the input signal. In particular, the system works well removing induced noise, which is coupled into the subject network, e.g. coupled switching noise. If a known higher frequency component is known to be present in the incoming signal, e.g. there is relatively high power at a known higher frequency signal, the frequency of the sampling function should be chosen to not correlate with the higher frequency signal.

FIGS. 5-8 show how a signal may be conceptualized from a time domain perspective. Specifically, FIG. 5 shows an example signal having a periodic noise component shown by the spikes 50. As show in FIG. 5, a typical switching noise impulse train will have a noise impulse which occurs periodically, for example after every interval T1. As shown in FIG. 6, typically a noise impulse is of infinitesimal duration. Likewise, the duration of the sampling function is also infinitesimal, so that the sampling function is required to coincide very closely with occurrence of the noise spike for the sampling function to detect the occurrence of the noise spike.

FIG. 7 shows an example noise impulse train and a sampling function. Assume, for example, that the noise impulse train has noise impulses that occur much more frequently than the signal is sampled. If the sampling function happens to sample at a point in time when the noise function is visible on the signal, then the noise will be visible to the digital computer. If the sampling function does not coincide with the noise function, as shown in FIG. 7, the output of the analog to digital converter will not show a contribution from the noise component. FIG. 8 shows an example of the output voltage registered by the ADC where the sampling function does not coincide with the noise function. As shown in FIG. 8, the noise does not contribute to the output signal unless the sampling function causes the digital signal to be sampled at the same time as the noise function is contributing to the signal.

In some example circuits, the noise function and the sampling function may not coincide frequently, for example the sampling function may cause the noise component to be visible only once every 100000 samples. However, when it does, the noise component can cause problems for numerical algorithms executing on the digital computer. Hence, applicants have proposed to utilize a slope limiter in a signal restrictor circuit to remove the noise from the signal when it appears. By analyzing the signal in the time domain, and preventing sudden increases/decreases between samples, applicants found that it is possible to digitally sample an input signal and reduce the noise contribution attributable to higher frequency components without requiring the use of an anti-aliasing filter.

Figure 9:
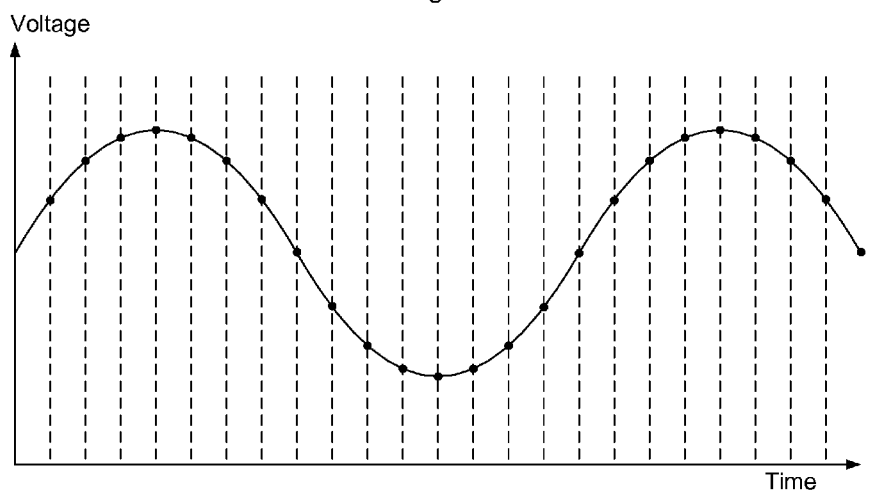
FIG. 9 is a graph showing an example of a sampled sinusoid.
Figure 10:
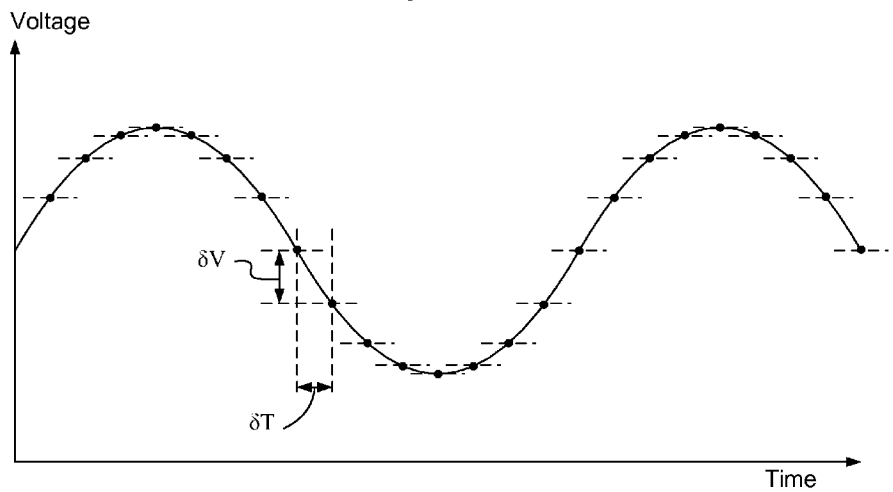
FIG. 10 is a graph showing a set of sampled points on the example waveform of FIG. 9 and showing calculation of a first derivative of the waveform based on the sampled signal.
Figure 11:
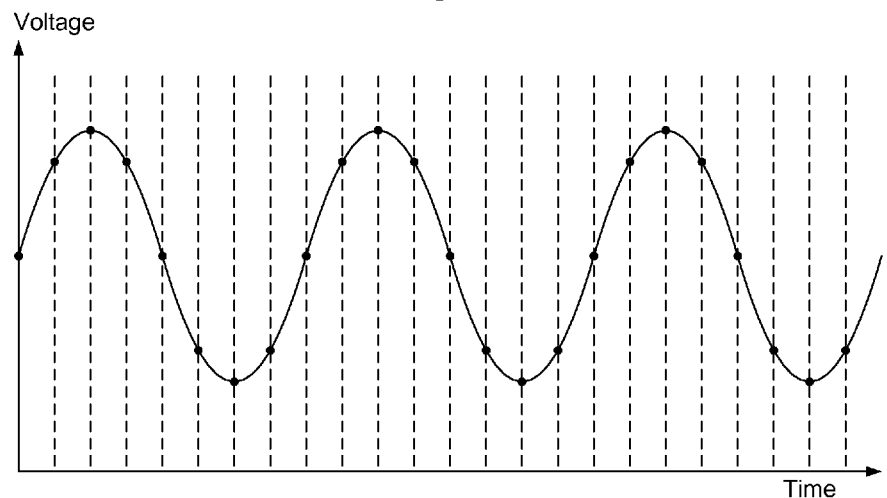
FIG. 11 is a graph showing another example waveform having a higher frequency than the waveform shown in FIG. 9.
Figure 12:
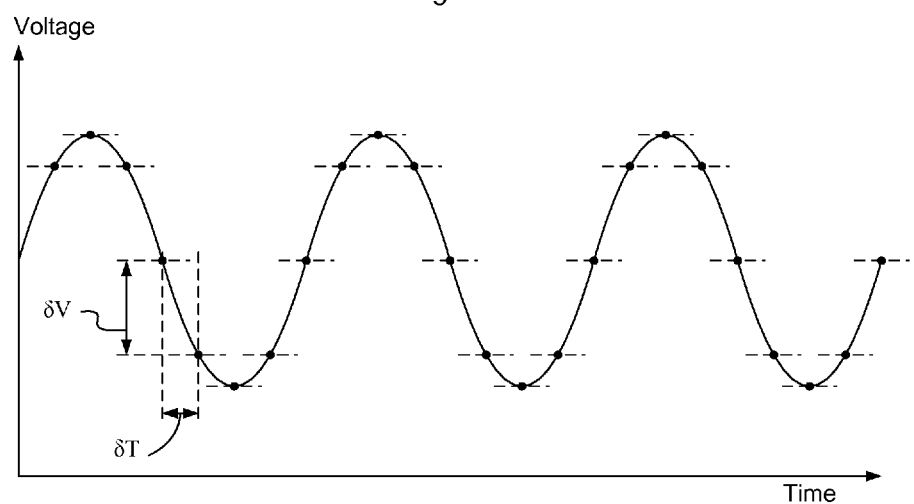
FIG. 12 is a graph showing a set of sampled points on the example waveform of FIG. 11 and showing calculation of a first derivative of the waveform based on the sampled signal.

FIGS. 9-12 show conceptually how the slope limiter prevents higher frequencies from contributing to the output of the signal restrictor. Specifically, FIG. 9 shows a first signal having a first frequency that allows it to be sampled 16 times by an ADC during each cycle, and FIG. 11 shows a second signal at twice the frequency which allows it to be sampled 8 times by an ADC sampling at the same rate. FIGS. 10 and 12 show the voltages output by the ADC when sampling the waveforms shown in FIGS. 9 and 11, respectively.

FIGS. 10 and 12 also show the maximum voltage change that would be measured by an ADC while sampling the waveforms of FIGS. 9. and 11. As shown in FIG. 10, the output value from the ADC will change by an amount proportionate to the change in voltage δV during any one sampling period δT. If both waveforms have the same amplitude, a lower frequency waveform will experience a smaller change in voltage δV during a given sampling interval δT (see FIG. 10) than would be expected to be experienced by a higher frequency waveform during the same sampling interval (see FIG. 12). Applicants realized that post-sampling processing of the ADC output could be used to prevent the change in value of the ADC from exceeding the expected output change given the target frequency. Specifically, by preventing the output from changing more than a particular amount (limit 44), contribution of noise on the signal, which could artificially make the signal increase/decrease excessively, is constrained. Thus, in this example, if the limit was set to correspond to the change in voltage δV shown in FIG. 10, if the ADC instead output a value corresponding to the change in voltage shown in FIG. 12, the slope limiter would reduce the ADC value to that shown in FIG. 10 to thereby prevent the higher frequency contribution from affecting the output 34.

The statistical process 42 is used to set the slope limit which is then used by the slope limiter 40 to adjust the output of the ADC to reduce contribution of the higher frequency components. As explained above, the slope of the signal is limited by constraining the amount that the output of the ADC is allowed to change in any particular sampling interval. Constraining the amount the signal is allowed to rise or fall constrains the first derivative of the signal (i.e. the slope) which effectively limits the frequency output from the ADC. The statistical process determines the limit to be applied by the slope limiter based on the expected frequency and the expected amplitude of the signal. Optionally, the amplitude of the signal may be normalized by the statistical process 42 to simplify processing.

The statistical function collects data to calculate an applicable average value which will be used to determine the slope limit. If the expected signal is a DC signal, the mean value (arithmetic average) should be calculated. This value may be used by the statistical processor of FIG. 4 to determine an output value. If the expected signal is an AC signal, the standard deviation (Root Mean Squared—RMS) value should be calculated. The RMS value is then multiplied by a normalized slope limit to determine the maximum voltage change during any particular sampling interval. If the expected signal contains both DC and AC components, both averages may be required.

Figure 13:
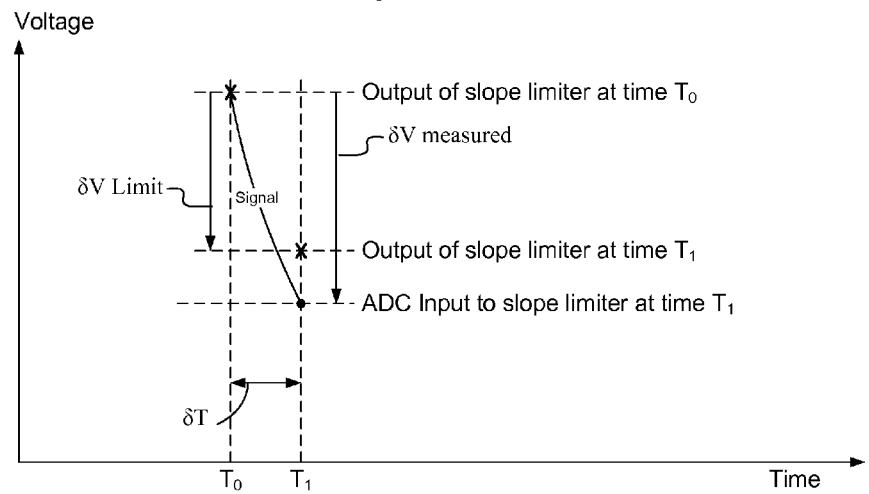
FIGS. 13-14 show application of a limit function to the first derivative of the input signal to prevent the output of the analog to digital converter from exceeding a maximum rate of rise or fall according to an embodiment of the invention.
Figure 14:
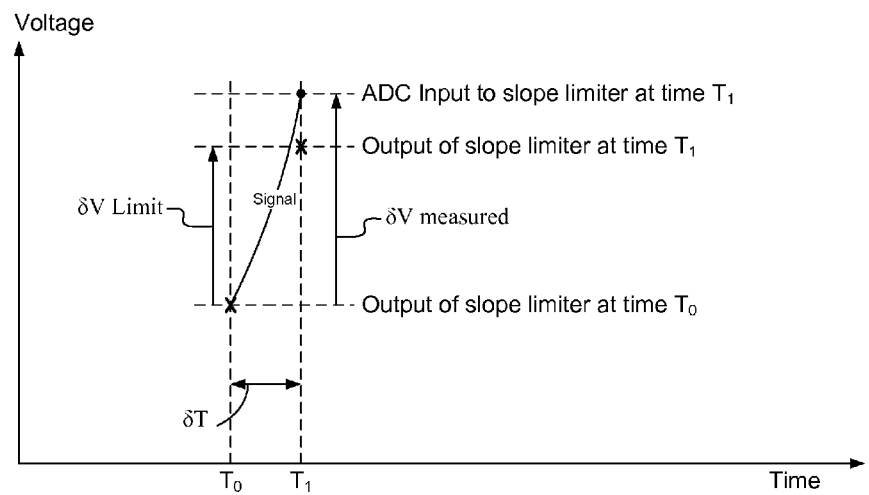

FIG. 13 shows an example of how the limit may be applied when the signal is decreasing and FIG. 14 shows how the limit may be applied when the signal is increasing. Specifically, as shown in FIG. 13, the when the signal is decreasing too fast, the change in voltage measured δV by the ADC will exceed the δV limit imposed by the signal restrictor. Accordingly, the signal restrictor will limit the amount that the output at time $T_1$ can decrease as compared to the value of the output at time $T_0$. Likewise as shown in FIG. 14, if the signal is increasing too fast, the change in voltage measured δV by the ADC will exceed the δV limit imposed by the signal restrictor. Accordingly, the signal restrictor will limit the amount that the output at time $T_1$ can increase as compared to the value of the output at time $T_0$.

Figure 15:
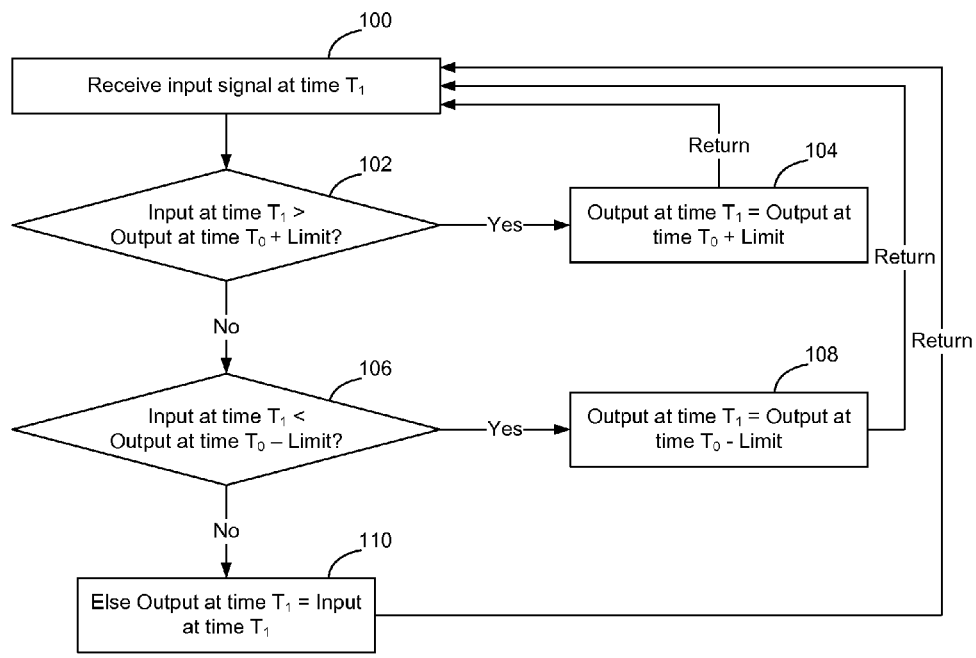
FIG. 15 shows an example process of applying a limit function to the first derivative of the input signal to prevent the output of the analog to digital converter from exceeding a maximum rate of rise or fall according to an embodiment of the invention.

FIG. 15 shows an example process that may be implemented by the slope limiter according to an embodiment of the invention. As shown in FIG. 15, the slope limiter will receive an input signal from the ADC at time $T_1$ (100). The slope limiter will then perform a series of checks to determine if the input at time $T_1$ is greater than the output at time $T_0$ plus the limit set by the statistical process 42 (102). If so, the slope limiter will clamp the output value so that the output at time $T_1$ is equal to the output at time $T_0$ plus the limit (104). The slope limiter will also check to determine if the input at time $T_1$ is smaller than the output at time $T_0$ minus the limit set by the statistical process 42 (106). If so, the slope limiter will clamp the output value so that the output at time $T_1$ is equal to the output at time $T_0$ minus the limit (108). If neither of these conditions apply, the output of the slope limiter will be set to be equal to the output of the ADC (110). Once one of the conditions has been applied, the process will revert to (100) to wait for further input from the ADC.

In the preceding example, the signal restrictor operated by looking at the immediately prior value of the output of the ADC. Specifically, the signal restrictor set a maximum for the current output based on the previous output plus or minus a limit value. The limit value was based on the slope, e.g. the maximum first derivative of the target frequency. Other criteria may be specified as well that look beyond one sampling period. For example, the signal restrictor may look back two or more sampling periods to look at more than just the previous output value when determining the maximum output of the ADC for the current sample. In this way, a more refined limit may be applied to adjust the output of the ADC based on the anticipated waveform of the target frequency.

The functions associated with the slope limiter in particular or the signal restrictor in general may be implemented as a set of program instructions that are stored in a computer readable memory and executed on one or more processors on the computer platform. Preferably, however, these functions may be implemented using discrete components, integrated circuitry such as an Application Specific Integrated Circuit (ASIC), programmable logic used in conjunction with a programmable logic device such as a Field Programmable Gate Array (FPGA) or microprocessor, a state machine, or any other device including any combination thereof. Programmable logic can be fixed temporarily or permanently in a tangible medium such as hardware logic, a read-only memory chip, a computer memory, a disk, or other storage medium. All such embodiments are intended to fall within the scope of the present invention.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. Apparatus for reducing noise in digitally sampled signals, the apparatus comprising:
   an analog to digital converter configured to sample an analog signal to create a digital representation of the analog signal without first passing the analog signal through an anti-aliasing filter; and
   a bandwidth limiter coupled to an output of the analog to digital converter and configured to constrain a bandwidth of an output signal of the analog to digital converter by constraining an output signal of the analog to digital converter within a limit, the limit corresponding to a maximum first derivative value of a maximum frequency to be detected in the analog signal by the analog to digital converter.

2. The apparatus of claim 1, wherein:
   the analog to digital converter is configured to sample the analog signal at a sampling frequency; and
   the maximum frequency of the analog signal is at most half of the sampling frequency.

3. The apparatus of claim 1, further comprising a receiver configured to receive a signal, an input of the analog to digital converter being coupled to the receiver so that the analog to digital converter samples the received signal.

4. The apparatus of claim 1, further comprising a digital signal processor coupled to the bandwidth limiter, the digital signal processor being configured to digitally process an output signal of the bandwidth limiter.

5. Apparatus for reducing noise in digitally sampled signals, the apparatus comprising:
   an analog to digital converter configured to sample an analog signal to create a digital representation of the analog signal without first passing the analog signal through an anti-aliasing filter; and
   a bandwidth limiter coupled to an output of the analog to digital converter and configured to constrain a bandwidth of an output signal of the analog to digital converter;
   wherein the bandwidth limiter is configured to compare the output signal of the analog to digital converter to a moving average calculated using a set of previous constrained output signal values.

6. The apparatus of claim 5, wherein the bandwidth limiter is configured to replace one of the previous constrained output signal values in the set with a current constrained output signal value.

7. The apparatus of claim 1, wherein the bandwidth limiter is configured to cause the constrained output signal to be the same as the output of the analog to digital converter when the output from the analog to digital converter is less than a limit value higher than a previous output of the analog to digital converter.

8. The apparatus of claim 1, wherein the bandwidth limiter is configured to cause a value of the constrained output signal to be equal to a previous constrained output signal value plus a limit value when the output from the analog to digital converter is more than the limit value higher than a previous output of the analog to digital converter.

9. The apparatus of claim 1, wherein the bandwidth limiter is configured to cause a value of the constrained output signal to be equal to a previous constrained output signal value minus a limit value when the output from the analog to digital converter is less than the limit value lower than a previous output of the analog to digital converter.

10. Apparatus for reducing noise in digitally sampled signals, the apparatus comprising:
    analog to digital converting means configured to sample an analog signal to create a digital representation of the analog signal without first passing the analog signal through an anti-aliasing filter; and
    bandwidth limiting means coupled to an output of the analog to digital converting means and configured to constrain a bandwidth of an output signal of the analog to digital converting means;
    wherein the bandwidth limiting means comprises a slope limiting means configured to constrain the output signal of the analog to digital converting means within a limited rate of rise or fall, the limited rate of rise or fall corresponding to a maximum first derivative value of a maximum frequency to be detected in the input signal by the analog to digital converting means.

11. The apparatus of claim 10, wherein:
    the analog to digital converter means is configured to sample the analog signal at a sampling frequency; and
    the maximum frequency of the analog signal is at most half of the sampling frequency.

12. The apparatus of claim 10, further comprising receiving means configured to receive a signal, an input of the analog to digital converting means being coupled to the receiving means so that the analog to digital converting means samples the received signal.

13. The apparatus of claim 10, further comprising a digital signal processing means coupled to the bandwidth limiting means, the digital signal processing means being configured to digitally process an output signal of the bandwidth limiting means.

14. Apparatus for reducing noise in digitally sampled signals, the apparatus comprising:
    analog to digital converting means configured to sample an analog signal to create a digital representation of the analog signal without first passing the analog signal through an anti-aliasing filter; and
    bandwidth limiting means coupled to an output of the analog to digital converting means and configured to constrain a bandwidth of an output signal of the analog to digital converting means;
    wherein the bandwidth limiting means is configured to compare the output signal of the analog to digital converting means to a moving average calculated using a set of previous constrained output signal values.

15. Apparatus for reducing noise in digitally sampled signals, the apparatus comprising:
    analog to digital converting means configured to sample an analog signal to create a digital representation of the analog signal without first passing the analog signal through an anti-aliasing filter; and
    bandwidth limiting means coupled to an output of the analog to digital converting means and configured to constrain a bandwidth of an output signal of the analog to digital converting means;
    wherein the bandwidth limiting means is configured to compare the output signal of the analog to digital converting means to a moving average calculated using a set of previous constrained output signal values and to replace one of the previous constrained output signal values in the set with a current constrained output signal value.

* * * * *